(12) United States Patent
Chiang et al.

(10) Patent No.: US 11,501,807 B1
(45) Date of Patent: Nov. 15, 2022

(54) MEMORY STORAGE APPARATUS AND OPERATING METHOD THEREOF

(71) Applicant: Winbond Electronics Corp., Taichung (TW)

(72) Inventors: Ju-An Chiang, Taichung (TW); Ya-Wen Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/341,387

(22) Filed: Jun. 8, 2021

(51) Int. Cl.
  *G11C 7/22* (2006.01)
  *G11C 7/20* (2006.01)
  *H03K 19/20* (2006.01)
  *G11C 8/10* (2006.01)

(52) U.S. Cl.
  CPC .......... *G11C 7/20* (2013.01); *G11C 8/10* (2013.01); *H03K 19/20* (2013.01)

(58) Field of Classification Search
  CPC ............ G11C 7/20; G11C 8/10; H03K 19/20
  USPC .................................................. 365/189.16
  See application file for complete search history.

(56) References Cited

U.S. PATENT DOCUMENTS 6,272,586 B1    8/2001   Roohparvar et al.

FOREIGN PATENT DOCUMENTS

JP    3132665 B2 *   2/2001
TW    202029039      8/2020

OTHER PUBLICATIONS

"Office Action of Taiwan Counterpart Application", dated May 27, 2022, p. 1-p. 7.

* cited by examiner

Primary Examiner — Huan Hoang
(74) Attorney, Agent, or Firm — JCIPRNET

(57) ABSTRACT

A memory storage apparatus including a memory circuit and a memory controller is provided. The memory circuit is configured to store data. The memory controller is coupled to the memory circuit via a data bus. The memory controller performs initial setting of the memory circuit on the basis of a width of the data bus. In addition, an operating method of a memory storage apparatus is also provided.

18 Claims, 6 Drawing Sheets

MEMORY STORAGE APPARATUS AND OPERATING METHOD THEREOF

BACKGROUND

Technical Field

The disclosure relates to an electronic apparatus and an operating method thereof, and in particular to a memory storage apparatus and an operating method thereof.

Description of Related Art

An electronic apparatus usually includes a nonvolatile memory storage apparatus and a volatile memory storage apparatus. Many important system setting parameters are stored in the nonvolatile memory storage apparatus. When the electronic apparatus is being powered on, a memory controller must read out the system setting parameters from the nonvolatile memory storage apparatus and store the system setting parameters to the volatile memory storage apparatus nearby to facilitate a subsequent operation.

Conventionally, in order to finish initial setting, a memory cell usually needs to include multiple NAND gates to receive a setting signal and a reset signal to perform the initial setting. Therefore, the area of an entire memory circuit is large.

SUMMARY

A memory storage apparatus of the disclosure includes a memory circuit and a memory controller. The memory circuit is adapted for storing data. The memory controller is coupled to the memory circuit via a data bus. The memory controller performs initial setting of the memory circuit on the basis of a width of the data bus.

An operating method of a memory storage apparatus of the disclosure includes the following. Initial setting data is received via a data bus. Initial setting of the memory circuit is performed on the basis of a width of the data bus.

Based on the above, in an embodiment of the disclosure, the memory controller performs the initial setting of the memory circuit on the basis of the width of the data bus, thereby improving the efficiency of the initial setting, simplifying the memory cell architecture, and scaling down the area occupied by the entire memory circuit.

To further describe the above features and advantages of the disclosure, embodiments accompanied with drawings are described below in details.

DESCRIPTION OF THE EMBODIMENTS

Figure 1:
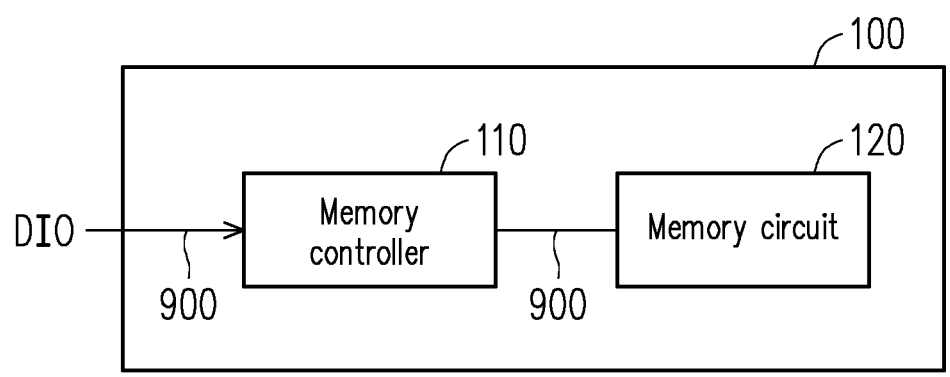
FIG. 1 illustrates a schematic diagram of a memory storage apparatus according to an embodiment of the disclosure.

FIG. 1 illustrates a schematic diagram of a memory storage apparatus according to an embodiment of the disclosure. Referring to FIG. 1, a memory storage apparatus 100 of this embodiment includes a memory controller 110 and a memory circuit 120. The memory circuit 120 is used to store data DIO to be written. The memory controller 110 is coupled to the memory circuit 120 via a data bus 900. The memory controller 110 performs initial setting of the memory circuit 120 on the basis of a width of the data bus 900.

For example, the width of the data bus 900 is, for example, N bits, which means that N bits of data may be written into the memory circuit 120 at the same time, where N is an integer greater than 1. In an embodiment, N is equal to 4. Therefore, the memory controller 110 may perform the initial setting of N (for example, 4) memory cells in the memory circuit 120 at the same time.

Specifically, an electronic apparatus usually includes a nonvolatile memory storage apparatus and a volatile memory storage apparatus. The memory storage apparatus 100 of this embodiment is, for example, a volatile memory storage apparatus in an electronic apparatus. Many important system setting parameters are stored in the nonvolatile memory storage apparatus. Before the execution of a power on sequence of the electronic apparatus, the memory storage apparatus 100 requires the system setting parameters as an initial value to facilitate a subsequent operation. Therefore, before the execution of the power on sequence of the electronic apparatus, a first setting performed to the memory storage apparatus 100 is an initial setting. In addition, the initial setting is finished before the execution of the power on sequence.

During the process of the initial setting, the memory controller 110 reads out the system setting parameters from the non-volatile memory storage apparatus, and stores the system setting parameters in the memory circuit 120. The system setting parameters include related parameters required for memory operations such as voltage setting and access time of the memory storage apparatus 100. In other words, the initial setting is parameters required for a write operation on the memory circuit 120, and the parameters required for the operation include, for example, voltage setting and access time.

In this embodiment, the memory controller 110 may be a processor with computing capability. Alternatively, the memory controller 110 may be a hardware circuit designed through a hardware description language (HDL) or any other digital circuit design methods well known to those with ordinary skill in the art, and realized by a field programmable logic gate array (FPGA), a complex programmable logic apparatus (CPLD), or an application-specific integrated circuit (ASIC).

Figure 2:
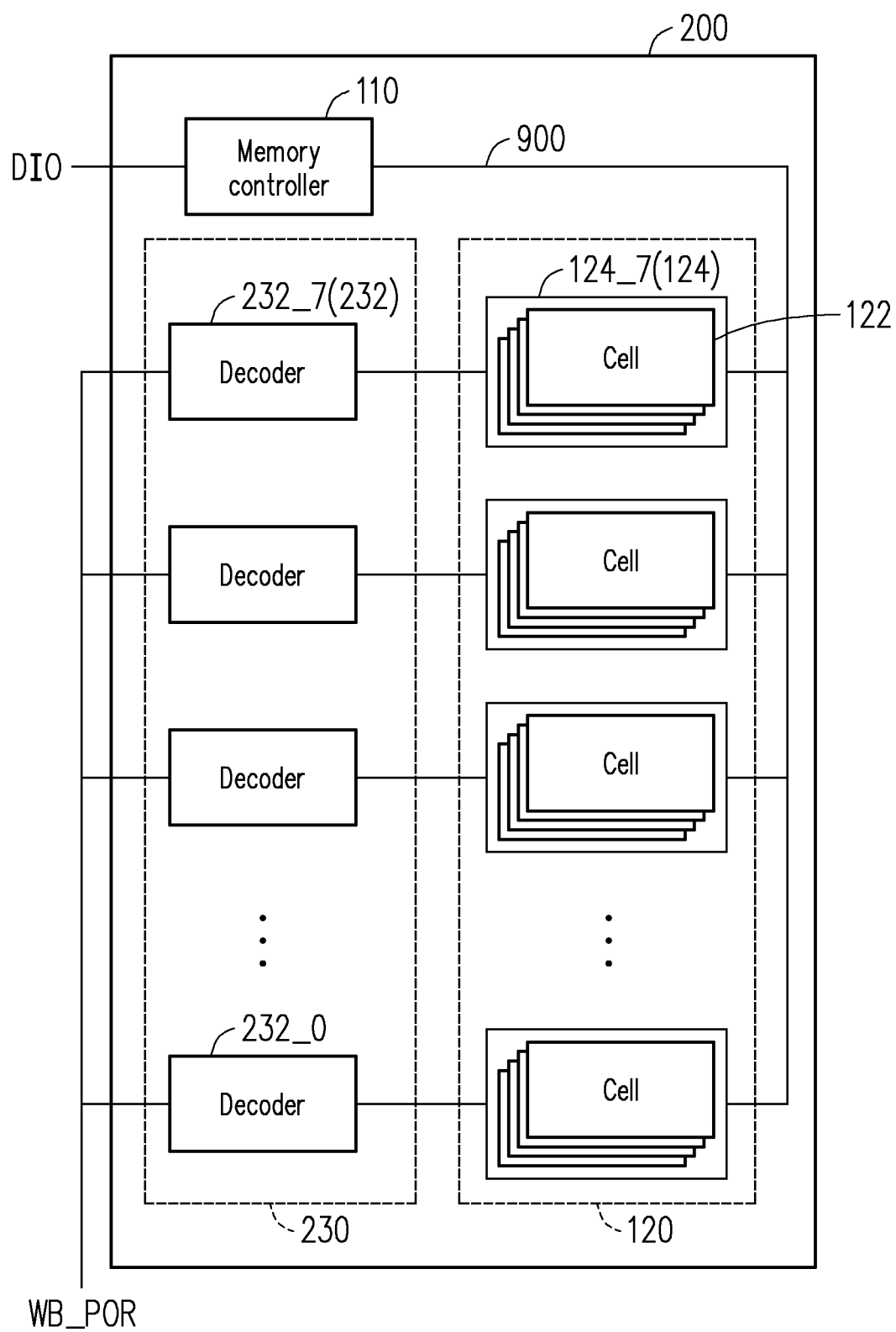
FIG. 2 illustrates a schematic diagram of a memory storage apparatus according to another embodiment of the disclosure.

FIG. 2 illustrates a schematic diagram of a memory storage apparatus according to another embodiment of the disclosure. Referring to FIG. 2, a memory storage apparatus 200 of this embodiment includes the memory controller 110, the memory circuit 120, and a decoder circuit 230. In this embodiment, the memory circuit 120 includes a plurality of memory cells 122. For example, the width of the data bus 900 is, for example, 4 bits, which means that the data bus 900 may transmit 4 bits in parallel at the same time to perform read and write operations on four memory cells 122 at the same time. Every four memory cells 122 are divided into one group, and the memory controller 110 performs initial setting of a group of memory cells (hereinafter referred to as a memory cell group 124) at the same time; that is, 4 bits are initialized each time. For each memory cell group 124, the memory controller 110 performs read and write operations on the memory cell group 124 via the data bus 900.

The decoder circuit 230 is coupled to the memory circuit 120. The decoder circuit 230 includes a plurality of decoders 232. The decoders 232 perform initial setting of the memory circuit 120 according to an initial setting signal WB_POR. In this embodiment, taking the decoder circuit 230 including eight decoders 232_0 to 232_7 as an example, each memory cell group 124 corresponds to one decoder 232. For example, a memory cell group 124_7 corresponds to the decoder 232_7. The decoder 232_7 decodes the initial setting signal WB_POR to output a control signal that controls the read and write operations of the memory cell group 124_7. The initial setting signal WB_POR is a decode control signal that resets a memory cell group by a predetermined period. The reset operation is finished before a power on reset operation.

Figure 3:
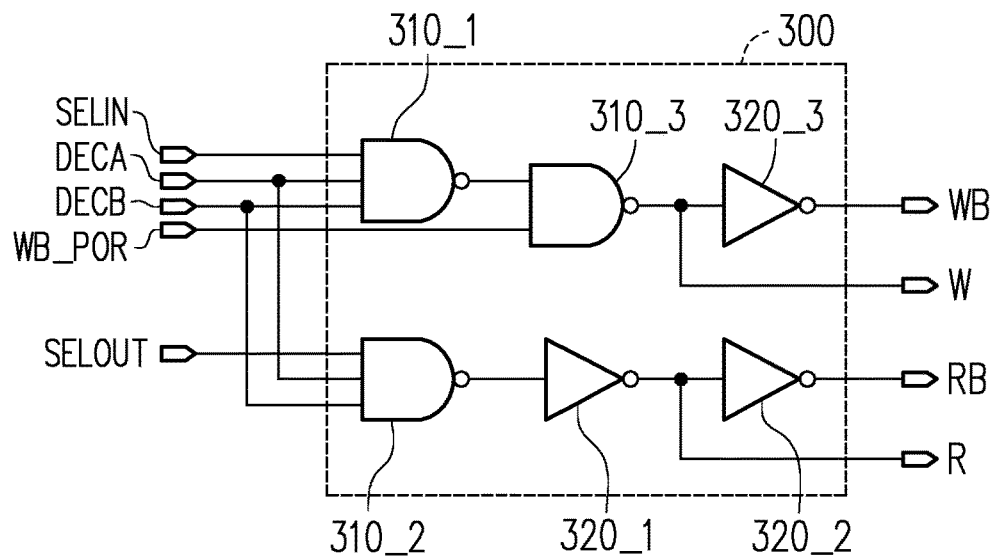
FIG. 3 illustrates a schematic circuit diagram of a decoder according to the embodiment of FIG. 2.

FIG. 3 illustrates a schematic circuit diagram of the decoder according to the embodiment of FIG. 2. Referring to FIG. 3, the decoder 232 includes a digital logic circuit 300 formed by a plurality of logic gates and having a decoding function. In this embodiment, the digital logic circuit 300 includes a plurality of NAND gates 310_1, 310_2, and 310_3 and a plurality of NOT gates 320_1, 320_2, and 320_3, and the coupling relationship thereof is shown in FIG. 3.

An output terminal of the first NAND gate 310_1 is coupled to a first input terminal of the third NAND gate 310_3. An output terminal of the third NAND gate 310_3 is coupled to an input terminal of the third NOT gate 320_3. A second input terminal and a third input terminal of the second NAND gate 310_2 are respectively coupled to a second input terminal and a third input terminal of the first NAND gate 310_1. An output terminal of the second NAND gate 310_2 is coupled to an input terminal of the first NOT gate 320_1. An output terminal of the first NOT gate 320_1 is coupled to an input terminal of the second NOT gate 320_2.

A first input terminal, the second input terminal, and the third input terminal of the first NAND gate 310_1 respectively receive a first control signal SELIN, a second control signal DECA, and a third control signal DECB. The first NAND gate 310_1 performs a NAND operation on the first control signal SELIN, the second control signal DECA, and the third control signal DECB. An operation result is output from output terminals of the first NAND gate 310_1 to the third NAND gate 310_3. The first input terminal and a second input terminal of the third NAND gate 310_3 respectively receive the operation result output by the first NAND gate 310_1 and the initial setting signal WB_POR. The third NAND gate 310_3A performs a NAND operation on the operation result output by the first NAND gate 310_1 and the initial setting signal WB_POR. The operation result is output from the output terminal of the third NAND gate 310_3 as a write control signal W. In addition, the third NAND gate 310_3 also outputs the write control signal W from the output terminal of the third NAND gate 310_3 to the third NOT gate 320_3. The input terminal of the third NOT gate 320_3 receives the write control signal W. The third NOT gate 320_3 performs an inverse operation on the write control signal W. An inverted signal WB is output from an output terminal of the third NOT gate 320_3.

A first input terminal, the second input terminal, and the third input terminal of the second NAND gate 310_2 respectively receive a fourth control signal SELOUT, the second control signal DECA, and the third control signal DECB. The second NAND gate 310_2A performs a NAND operation on the fourth control signal SELOUT, the second control signal DECA, and the third control signal DECB. The operation result is output from the output terminal of the second NAND gate 310_2 to the first NOT gate 320_1. The input terminal of the first NOT gate 320_1 receives the operation result output by the second NAND gate 310_2. The first NOT gate 320_1 performs an inverse operation on the operation result output by the second NAND gate 310_2. The operation result is output from the output terminal of the first NOT gate 320_1 as a read control signal R. In addition, the first NOT gate 320_1 also outputs the read control signal R from the output terminal of the first NOT gate 320_1 to the second NOT gate 320_2. The input terminal of the second NOT gate 320_2 receives the read control signal R. The second NOT gate 320_2 performs an inverse operation on the read control signal R. An inverted signal RB is output from an output terminal of the second NOT gate 320_2.

Therefore, the decoder 232 decodes the initial setting signal WB_POR according to the control signals SELIN, SELOUT, DECA, and DECB to output the read control signal R and the inverted signal RB thereof and the write control signal W and the inverted signal WB thereof. The read control signal R and the inverted signal RB thereof are used to control a data read operation of the memory cell 122. The write control signal W and the inverted signal WB thereof are used to control a data write operation of the memory cell 122. That is, the decoder 232 controls the data read operation or the data write operation of the control memory cell 122 according to the read control signal R or the write control signal W output by the initial setting signal WB_POR.

Figure 4:
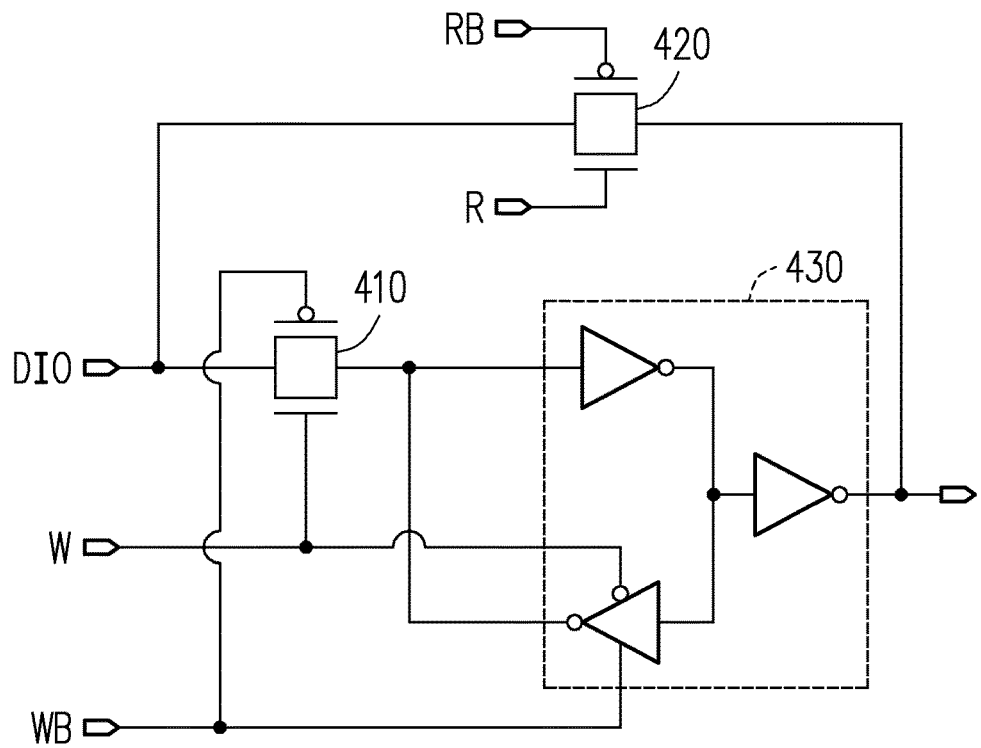
FIG. 4 illustrates a schematic circuit diagram of a memory cell according to the embodiment of FIG. 2.

FIG. 4 illustrates a schematic circuit diagram of the memory cell according to the embodiment of FIG. 2. Referring to FIG. 4, the memory cell 122 includes a first switch 410, a second switch 420, and a register circuit 430. The register circuit 430 is used to store the data DIO to be written into the memory cell 122. The first switch 410 is coupled to the register circuit 430. The first switch 410 is controlled by the write control signal W and the inverted signal WB thereof to control the data DIO to be written into the memory cell. The second switch 420 is coupled to the register circuit 430. The second switch 420 is controlled by the read control signal R and the inverted signal RB thereof to control the data DIO to be read out from the memory cell 122. In this embodiment, the first switch 410 and the second switch 420 are implemented with the method of a transmission gate, for example.

Conventionally, a memory cell usually needs to include a plurality of NAND gates to perform initial setting. Therefore, the area of the memory circuit is relatively large. In this embodiment, the memory cell 122 does not need a design of a plurality of NAND gates to receive the initial setting control signal. Therefore, the cell structure may be optimized as shown in FIG. 4, and the area of the memory circuit 120 may thus be reduced.

Figure 5:
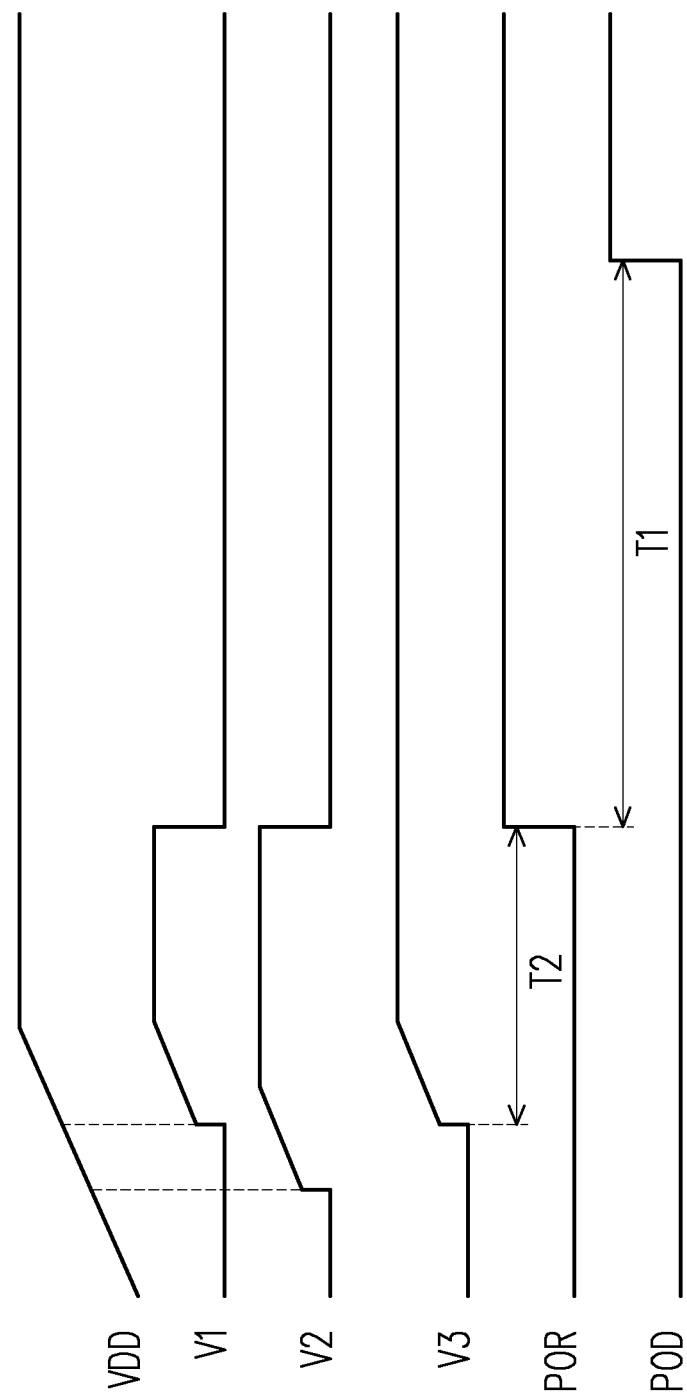
FIG. 5 illustrates a waveform diagram of each operation signal when a memory storage apparatus performs initial setting according to an embodiment of the disclosure.

FIG. 5 illustrates a waveform diagram of each operation signal when a memory storage apparatus performs initial setting according to an embodiment of the disclosure. Referring to FIGS. 1 and 5, before the electronic apparatus performs a power on sequence T1, the memory storage apparatus 100 performs the initial setting during an initial setting period T2.

Specifically, before the electronic apparatus performs the power on sequence T1, the memory storage apparatus 100 receives a system voltage VDD and generates voltage signals V1, V2, and V3 required for the operation of the power on sequence T1 accordingly. After the voltage signals V1, V2, and V3 are generated, a power on reset signal POR is pulled to a high level to perform the power on sequence T1. Next, when a power on done signal POD is pulled to a high level, it means that the power on sequence T1 has been finished. Therefore, the power on sequence T1 is defined by the power on reset signal POR and the power on done signal POD.

Figure 6:
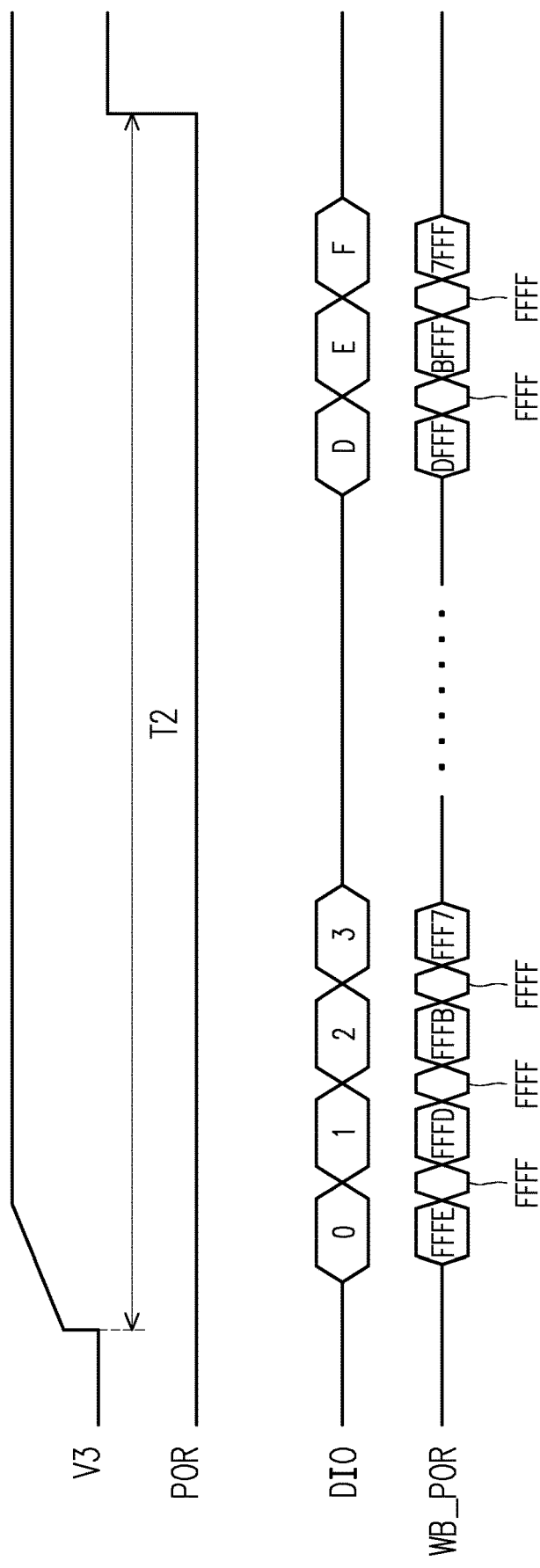
FIG. 6 illustrates a waveform diagram of initial setting data and initial setting signal according to an embodiment of the disclosure.

FIG. 6 illustrates a waveform diagram of initial setting data and an initial setting signal according to an embodiment of the disclosure. Referring to FIGS. 1 and 6, taking the initial setting data DIO with 16 pieces of data as an example, the write time of each piece of data may reach nearly 7 microseconds (us). In this embodiment, as long as the data packet of the initial setting signal WB_POR on a timing is aligned with every corresponding piece of data in the initial setting data DIO, all initial values may be written into the memory circuit 120 in the initial setting period T2. In this embodiment, the data of the initial setting signal WB_POR are 4-bit data expressed in hexadecimal.

Figure 7:
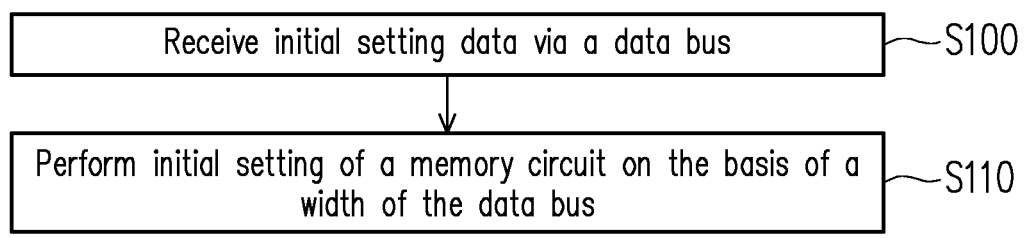
FIG. 7 illustrates a flowchart showing an operating method of a memory storage apparatus according to an embodiment of the disclosure.

FIG. 7 illustrates a flowchart showing an operating method of a memory storage apparatus according to an embodiment of the disclosure. Referring to FIGS. 1 and 7, the operating method of this embodiment is at least applicable to the memory storage apparatus 100 of FIG. 1, but the disclosure is not limited thereto. Taking the memory storage apparatus 100 in FIG. 1 as an example, in step S100, the memory controller 110 receives the initial setting data DIO via the data bus 900. In step S110, the memory controller 110 performs initial setting of the memory circuit 120 on the basis of a width of the data bus 900. In addition, sufficient teaching, suggestion and implementation description regarding the operating method of this embodiment may be obtained from the description of the embodiment of FIGS. 1 to 6.

In summary, in an embodiment of the disclosure, the memory controller performs the initial setting of the memory circuit on the basis of the width of the data bus before the power on sequence, thereby improving the efficiency of the initial setting. In addition, regarding performing the initial setting, the memory cell does not require a design of a plurality of NAND gates to receive the setting signal and the reset signal, thereby simplifying the memory cell architecture and scaling down the area occupied by the entire memory circuit.

Although the disclosure has been disclosed in the above by way of embodiments, the embodiments are not intended to limit the disclosure. Those with ordinary knowledge in the technical field can make various changes and modifications without departing from the spirit and scope of the disclosure. Therefore, the scope of protection of the disclosure is defined by the scope of the appended claims.

What is claimed is:

1. A memory storage apparatus, comprising:
a memory circuit, adapted for storing data, wherein the memory circuit comprises a plurality of memory cells, every N memory cells are divided into a group wherein N is an integer greater than 1; and
a memory controller, coupled to the memory circuit via a data bus, wherein the memory controller performs initial setting of the memory circuit on the basis of a width of the data bus, wherein the width of the data bus is N bits, and the memory controller performs the initial setting of a group of memory cells at the same time, wherein N is an integer greater than 1.

2. The memory storage apparatus according to claim 1, further comprising:
a decoder circuit, coupled to the memory circuit, wherein the decoder circuit comprises a plurality of decoders, wherein each group of memory cells corresponds to one of the decoders, and the decoders perform the initial setting of the memory circuit according to an initial setting signal.

3. The memory storage apparatus according to claim 2, wherein the decoders output a read control signal or a write control signal according to the initial setting signal to control a data read operation or a data write operation of the memory cells.

4. The memory storage apparatus according to claim 3, wherein each of the memory cells comprises:
a register circuit, adapted for storing data written into the memory cell;
a first switch, coupled to the register circuit, wherein the first switch is controlled by the write control signal to control the data to be written into the memory cell; and
a second switch, coupled to the register circuit, wherein the second switch is controlled by the read control signal to control the data to be read out from the memory cell.

5. The memory storage apparatus according to claim 3, wherein each of the decoders comprises a first NAND gate, a second NAND gate, a third NAND gate, a first NOT gate, a second NOT gate, and a third NOT gate, wherein
a first input terminal, a second input terminal, and a third input terminal of the first NAND gate respectively receive a first control signal, a second control signal, and a third control signal, the first NAND gate performs a NAND operation on the first control signal, the second control signal, and the third control signal, and an operation result is output from an output terminal of the first NAND gate to the third NAND gate;
a first input terminal and a second input terminal of the third NAND gate respectively receive the operation result output by the first NAND gate and the initial setting signal, the third NAND gate performs a NAND operation on the operation result output by the first NAND gate and the initial setting signal, the operation result is output from an output terminal of the third NAND gate as the write control signal, and the third NAND gate also outputs the write control signal from the output terminal of the third NAND gate to the third NOT gate; and
an input terminal of the third NOT gate receives the write control signal, the third NOT gate performs an inverse operation on the write control signal, and an inverted signal of the write control signal is output from an output terminal of the third NOT gate.

6. The memory storage apparatus according to claim 5, wherein
a first input terminal, a second input terminal, and a third input terminal of the second NAND gate respectively receive a fourth control signal, the second control signal, and the third control signal, the second NAND gate performs a NAND operation on the fourth control signal, the second control signal, and the third control signal, and an operation result is output from an output terminal of the second NAND gate to the first NOT gate;

an input terminal of the first NOT gate receives the operation result output by the second NAND gate, the first NOT gate performs an inversion operation on the operation result output by the second NAND gate, the operation result is output from an output terminal of the first NOT gate as the read control signal, and the first NOT gate also outputs the read control signal from the output terminal of the first NOT gate to the second NOT gate; and an input terminal of the second NOT gate receives the read control signal, the second NOT gate performs an inverse operation on the read control signal, and an inverted signal of the read control signal is output from an output terminal of the second NOT gate.

7. The memory storage apparatus according to claim 1, wherein the initial setting is finished before an execution of a power on sequence, and the power on sequence is defined by a power on reset signal and a power on done signal.

8. The memory storage apparatus according to claim 1, wherein the initial setting is parameters required for a write operation on the memory circuit.

9. The memory storage apparatus according to claim 8, wherein the parameters required for the operation comprise voltage setting and access time.

10. An operating method of a memory storage apparatus, wherein the memory storage apparatus comprises a memory circuit, wherein the memory circuit comprises a plurality of memory cells, and the operating method comprises:
receiving initial setting data via a data bus;
dividing every N memory cells into a group, wherein N is an integer greater than 1;
performing initial setting of the memory circuit on the basis of a width of the data bus, wherein the width of the data bus is N bits; and
performing the initial setting of a group of memory cells at the same time.

11. The operating method of a memory storage apparatus according to claim 10, wherein in performing the initial setting of the memory circuit on the basis of the width of the data bus, the initial setting is performed on the memory circuit according to an initial setting signal.

12. The operating method of a memory storage apparatus according to claim 11, further comprising:
outputting a read control signal or a write control signal according to the initial setting signal to control a data read operation or a data write operation of the memory cells.

13. The operating method of a memory storage apparatus according to claim 10, wherein the initial setting is finished before an execution of a power on sequence, and the power on sequence is defined by a power on reset signal and a power on done signal.

14. The operating method of a memory storage apparatus according to claim 10, wherein the initial setting is parameters required for a write operation on the memory circuit.

15. The operating method of a memory storage apparatus according to claim 14, wherein the parameters required for the operation comprises voltage setting and access time.

16. A memory storage apparatus, comprising:
a memory circuit, adapted for storing data; and
a memory controller, coupled to the memory circuit via a data bus, wherein the memory controller performs initial setting of the memory circuit on the basis of a width of the data bus, wherein the initial setting is finished before an execution of a power on sequence, and the power on sequence is defined by a power on reset signal and a power on done signal.

17. The memory storage apparatus according to claim 16, wherein the initial setting is parameters required for a write operation on the memory circuit.

18. The memory storage apparatus according to claim 17, wherein the parameters required for the operation comprise voltage setting and access time.

* * * * *